United States Patent
Kang (10) Patent No.: US 11,128,283 B1
(45) Date of Patent: Sep. 21, 2021

(54) EMPHASIS CIRCUIT AND TRANSMITTER INCLUDING THE SAME

(71) Applicant: SK hynix Inc., Gyeonggi-do (KR)

(72) Inventor: Ji Hyo Kang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/988,211

(22) Filed: Aug. 7, 2020

(30) Foreign Application Priority Data

May 21, 2020 (KR) .................. 10-2020-0060846

(51) Int. Cl.
| | | |
|---|---|---|
| H03B 1/00 | (2006.01) | |
| H03K 3/00 | (2006.01) | |
| H03K 3/037 | (2006.01) | |
| G11C 7/10 | (2006.01) | |

(52) U.S. Cl.
CPC .............. *H03K 3/037* (2013.01); *G11C 7/10* (2013.01)

(58) Field of Classification Search
CPC ....... H03K 19/00315; H03K 19/00361; H03K 19/0013; H03K 19/018521; H03K 17/164; H03K 5/01; H03K 5/04; H03K 5/12; H03K 5/13; H03K 5/134; H03K 19/00369; G06F 1/04; G06F 1/06; H02M 2001/0029; H02M 2001/017509
USPC ................................................. 327/108–112
See application file for complete search history.

(56) References Cited

U.S. PATENT DOCUMENTS

| | | | | |
|---|---|---|---|---|
| 5,122,690 | A * | 6/1992 | Bianchi | H03K 19/018528 326/27 |
| 5,977,790 | A * | 11/1999 | Sanwo | H03K 19/00361 326/27 |
| 6,208,168 | B1 | 3/2001 | Rhee | |
| 6,242,942 | B1 * | 6/2001 | Shamarao | H03K 17/164 326/27 |
| 6,975,135 | B1 * | 12/2005 | Bui | H03K 19/018585 326/29 |
| 7,102,449 | B1 * | 9/2006 | Mohan | H03K 3/0322 327/57 |
| 9,356,599 | B1 * | 5/2016 | Abdul-Latif | H03K 19/018514 |

FOREIGN PATENT DOCUMENTS

KR 10-2017-0072391 6/2017

* cited by examiner

*Primary Examiner* — Quan Tra
(74) *Attorney, Agent, or Firm* — IP & T Group LLP (57) ABSTRACT

A transmitter may include an emphasis circuit suitable for generating a first pull-down driving signal in response to first data and delayed second data, and generating a first pull-up driving signal in response to second data and delayed first data, wherein the first and second data are a differential pair; a phase skew compensation circuit suitable for compensating for a phase skew between the first pull-up driving signal and the first pull-down driving signal to generate a second pull-up driving signal and a second pull-down driving signal; a pull-up driver suitable for pull-up driving an output node in response to the second pull-up driving signal; and a pull-down driver suitable for pull-down driving the output node in response to the second pull-down driving signal.

19 Claims, 5 Drawing Sheets

EMPHASIS CIRCUIT AND TRANSMITTER INCLUDING THE SAME

CROSS-REFERENCE TO RELATED APPLICATION

This application claims priority under 35 U.S.C. § 119 to Korean Patent Application No. 10-2020-0060846 filed on May 21, 2020, which is incorporated herein by reference in its entirety.

BACKGROUND

1. Field

Various embodiments relate to a transmitter used to transmit a signal (e.g., data) in a variety of types of integrated circuits.

2. Discussion of the Related Art

In a semiconductor system, integrated circuit chips operate while exchanging signals (e.g., data) with peripheral chips. For example, memory chips, such as a DRAM and a flash memory, exchange data with a memory controller. A central processing unit (CPU) also exchanges data with a variety of types of chips on a motherboard. Furthermore, signals are transmitted not only between chips, but between circuits within one integrated circuit chip. A circuit that transmits a signal is referred to as a transmitter or an output driver.

As the operating speed of integrated circuits increases and the data rate of a signal transmitted by a transmitter becomes high, there is a growing need to perform various operations for increasing the quality of a signal (i.e., signal integrity) transmitted by the transmitter.

SUMMARY

Various embodiments are directed to a technology for improving the quality of a transmitter using a simple structure.

In an embodiment, a transmitter may include an emphasis circuit suitable for generating a first pull-down driving signal in response to first data and delayed second data, and generating a first pull-up driving signal in response to second data and delayed first data, wherein the first and second data are a differential pair; a phase skew compensation circuit suitable for compensating for a phase skew between the first pull-up driving signal and the first pull-down driving signal to generate a second pull-up driving signal and a second pull-down driving signal; a pull-up driver suitable for pull-up driving an output node in response to the second pull-up driving signal; and a pull-down driver suitable for pull-down driving the output node in response to the second pull-down driving signal.

In an embodiment, a transmitter may include a first inverter suitable for inverting a signal of a first node to which second data are applied to drive a third node; a second inverter suitable for inverting a signal of a second node to which first data are applied to drive a fourth node; a third inverter suitable for inverting a signal of the third node to drive the second node; a fourth inverter suitable for inverting a signal of the fourth node to drive the first node; fifth and sixth inverters coupled in series to drive the signal of the third node to a fifth node; seventh and eighth inverters coupled in series to drive the signal of the fourth node to a sixth node; a ninth inverter suitable for inverting the signal of the third node to drive the sixth node; a tenth inverter suitable for inverting the signal of the fourth node to drive the fifth node; an eleventh inverter suitable for outputting a pull-up driving signal by inverting a signal of the fifth node; a twelfth inverter suitable for outputting a pull-down driving signal by inverting a signal of the sixth node; a pull-up driver suitable for pull-up driving an output node in response to the pull-up driving signal; and a pull-down driver suitable for pull-down driving the output node in response to the pull-down driving signal.

In an embodiment, an emphasis circuit may include a first inverter configured to invert a first data to drive a first output node; a second inverter configured to invert a second data to drive a second output node; a third inverter configured to invert a signal of the first output node to drive a node to which the first data is input; and a fourth inverter configured to invert a signal of the second output node to drive a node to which the second data is input, wherein the first and second data are a differential pair.

DETAILED DESCRIPTION

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or it is clear from the context to be directed to a singular form.

Figure 1:
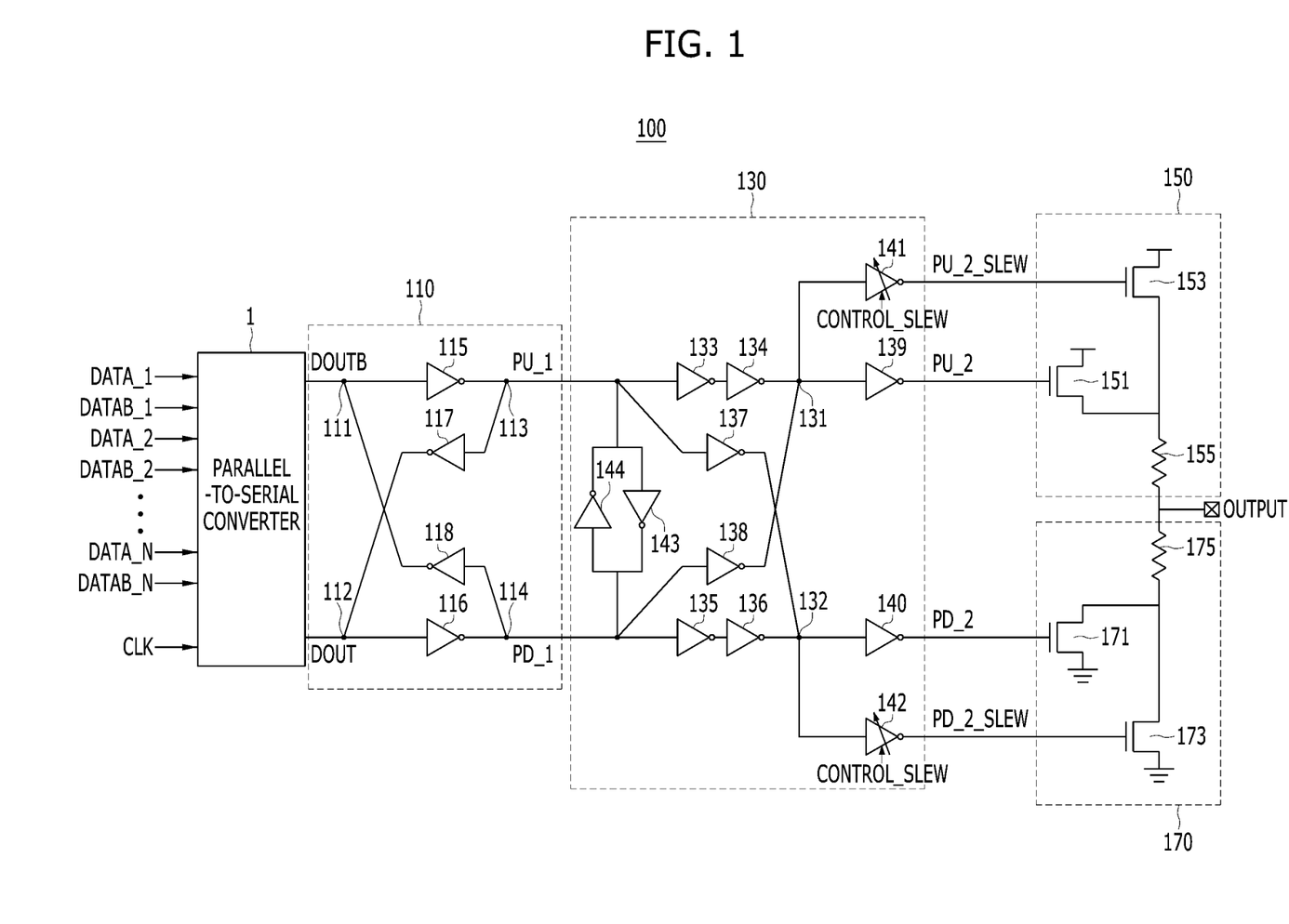
FIG. 1 is a diagram illustrating a configuration of a transmitter according to an embodiment of the present invention.

FIG. 1 is a diagram illustrating a configuration of a transmitter 100 according to an embodiment of the present invention. FIG. 1 also illustrates a parallel-to-serial converter 1 at the front end of the transmitter 100 in addition to the transmitter 100.

The parallel-to-serial converter 1 may convert N parallel data DATA_1, DATAB_1 to DATA_N, and DATAB_N into first data DOUT and second data DOUTB (i.e., N:1 parallel-to-serial conversion) using a clock CLK. The N parallel data DATA_1, DATAB_1 to DATA_N, and DATAB_N input to the parallel-to-serial converter 1 may have a differential type including N parallel first data DATA_1 to DATA_N and N parallel second data DATAB_1 to DATAB_N. Data output from the parallel-to-serial converter 1 may also have a differential type including the first data DOUT and the second data DOUTB. The first data DOUT and second data DOUTB are differential pair, that is, the second data DOUTB is complementary signal of the first data DOUT. FIG. 1 illustrates that the parallel-to-serial converter 1 is positioned at the front end of the transmitter 100, but this is merely illustrative. A different type of circuit may be positioned at the front end of the transmitter 100.

The transmitter 100 may transmit the data DOUT and DOUTB to an output node OUTPUT. The transmitter 100 may include an emphasis circuit 110, a phase skew compensation circuit 130, a pull-up driver 150 and a pull-down driver 170.

The emphasis circuit 110 may generate a first pull-up driving signal PU_1 in response to the second data DOUTB and delayed first data, and may generate a first pull-down driving signal PD_1 in response to the first data DOUT and delayed second data. The emphasis circuit 110 may include a node 111 to which the second data DOUTB is input, a node 112 to which the first data DOUT is input, a node 113 from which the first pull-up driving signal PU_1 is output, a node 114 from which the first pull-down driving signal PD_1 is output. The emphasis circuit 110 may further include an inverter 115 for inverting a signal of the node 111 and driving the inverted signal to the node 113, an inverter 116 for inverting a signal of the node 112 and driving the inverted signal to the node 114, an inverter 117 for inverting a signal of the node 113 and driving the inverted signal to the node 112, and an inverter 118 for inverting a signal of the node 114 and driving the inverted signal to the node 111. The inverters 115 and 116 may be for transmitting the second data DOUTB and the first data DOUT to the nodes 113 and 114, respectively. The inverters 117 and 118 may be for an emphasis by cross-feeding back the delayed second data and the delayed first data to the node 112 and the node 11, respectively. Accordingly, the driving power of the inverters 115 and 116 may be greater than the driving power of the inverters 117 and 118.

Figure 2:
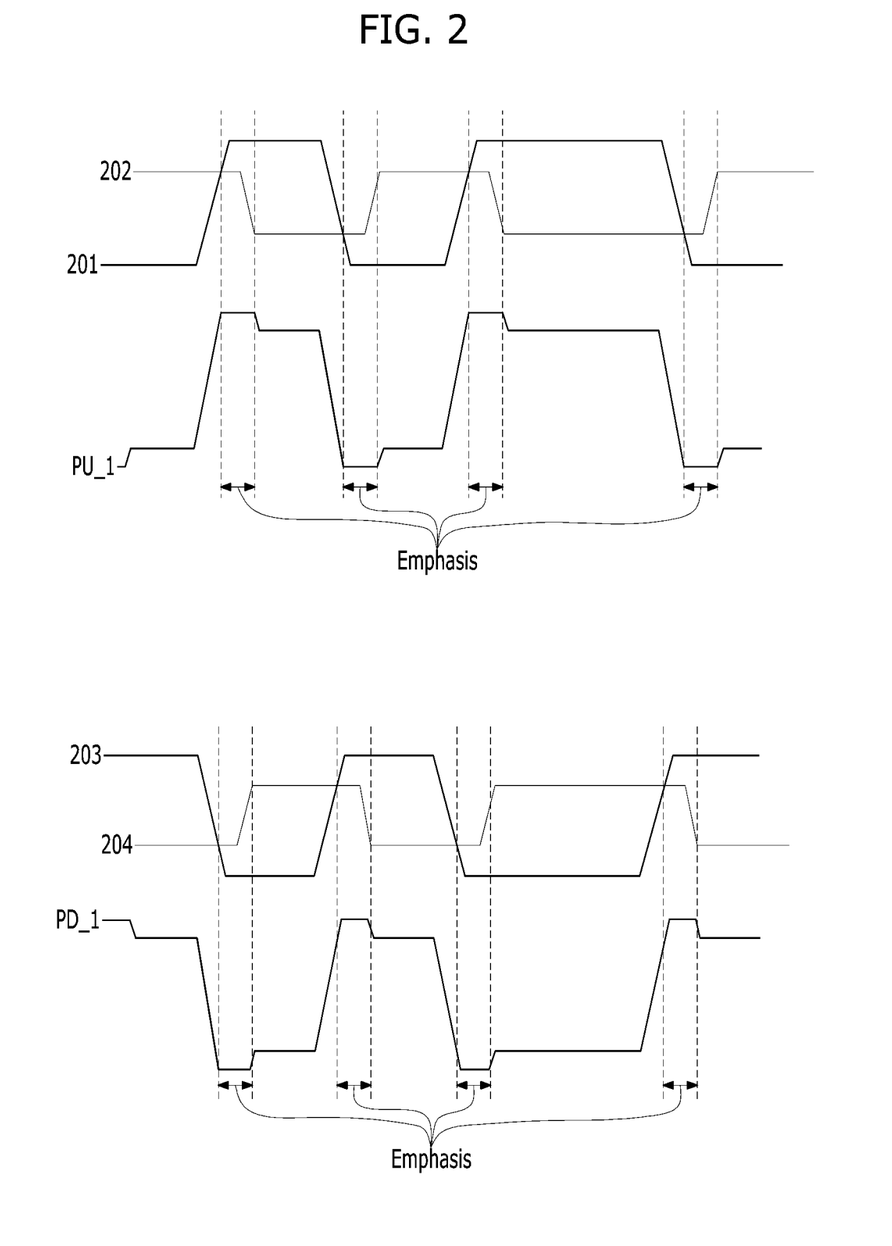
FIG. 2 is a diagram for describing an operation of an emphasis circuit shown in FIG. 1.

FIG. 2 is a diagram for describing an operation of the emphasis circuit 110. In FIG. 2, "201" may illustrate that the second data DOUTB have been driven to the node 113 by the inverter 115. "202" may illustrate that the first data DOUT have been driven to the node 113 by the inverter 116, the inverter 118 and the inverter 115. "201" and "202" may be combined (i.e., added) to become the first pull-up driving signal PU_1. The first pull-up driving signal PU_1 may be emphasized whenever the signal makes a transition. The length of the emphasis period may be the same as the sum of delay values of two inverters 116 and 118.

In FIG. 2, "203" may illustrate that the first data DOUT have been driven to the node 114 by the inverter 116. "204" may illustrate that the second data DOUTB have been driven to the node 114 by the inverter 115, the inverter 117 and the inverter 116. "203" and "204" may be combined (i.e., added) to become the first pull-down driving signal PD_1. The first pull-down driving signal PD_1 may be emphasized whenever the signal makes a transition. The length of the emphasis period may be the same as the sum of delay values of two inverters 115 and 117.

Referring back to FIG. 1, the phase skew compensation circuit 130 may compensate for a phase skew between the first pull-up driving signal PU_1 and the first pull-down driving signal PD_1 to generate a second pull-up driving signal PU_2 and a second pull-down driving signal PD_2. The phase skew compensation circuit 130 may further generate an auxiliary pull-up driving signal PU_2_SLEW and an auxiliary pull-down driving signal PD_2_SLEW. The auxiliary pull-up driving signal PU_2_SLEW may be a slew rate-controlled signal of the second pull-up driving signal PU_2, of which a slew rate is controlled according to a slew rate control signal CONTROL_SLEW. The auxiliary pull-down driving signal PD_2_SLEW may be a slew rate-controlled signal of the second pull-down driving signal PD_2, of which a slew rate is controlled according to the slew rate control signal CONTROL_SLEW.

The phase skew compensation circuit 130 may include two inverters 133 and 134 coupled in series to drive the signal of the node 113 (i.e., PU_1) to a node 131, two inverters 135 and 136 coupled in series to drive the signal of the node 114 (i.e., PD_1) to a node 132. The phase skew compensation circuit 130 may further include an inverter 137 configured to invert the signal of the node 113 (i.e., PU_1) and drive the inverted signal to the node 132, an inverter 138 configured to invert the signal of the node 114 (i.e., PD_1) and drive the inverted signal to the node 131, an inverter 139 configured to invert the signal of the node 131 and output the inverted signal as the second pull-up driving signal PU_2, an inverter 140 configured to invert the signal of the node 132 and output the inverted signal as the second pull-down driving signal PD_2, a variable driving inverter 141 configured to invert the signal of the node 131 and output the inverted signal as the second auxiliary pull-up driving signal PU_2_SLEW, and a variable driving inverter 142 configured to invert the signal of the node 132 and output the inverted signal as the second auxiliary pull-down driving signal PD_2_SLEW. The phase skew compensation circuit 130 may further include an inverter 143 configured to invert the signal of the node 113 (i.e., PU_1) and drive the inverted signal to the node 114 and an inverter 144 configured to invert the signal of the node 114 (i.e., PD_1) and drive the inverted signal to the node 113. The two inverters 143 and 144 may form a latch.

The inverters 133, 134, and 138 may synthesize a delayed signal of the first pull-up driving signal PU_1 and the inverted signals of the first pull-down driving signal PD_1, and output the synthesized signal to the node 131. The synthesis may be obtained by averaging the delayed signal of the first pull-up driving signal PU_1 and the inverted signals of the first pull-down driving signal PD_1, and output the synthesized signal to the node 131. The inverter 139 may generate the second pull-up driving signal PU_2 by inverting the synthesized signal of the node 131. Accordingly, the second pull-up driving signal PU_2 may be a signal obtained by compensating for a phase skew between the first pull-up driving signal PU_1 and the first pull-down driving signal PD_1. Likewise, the inverters 135, 136, and 137 may synthesize a delayed signal of the first pull-up driving signal PU_1 and the inverted signal of the first pull-down driving signal PD_1, and output the synthesized signal to the node 132. The synthesis may be obtained by averaging the delayed signal of the first pull-up driving signal PU_1 and the inverted signal of the first pull-down driving signal PD_1. The inverter 140 may generate the second pull-down driving signal PD_2 by inverting the synthesized signal of the node 132. Accordingly, the second pull-down driving signal PD_2 may be a signal obtained by compensating for a phase skew between the first pull-down driving signal PD_1 and the first pull-up driving signal PU_1. Furthermore, the inverter 143 may invert the signal of the node 113 and drive the inverted signal to the node 114, and the inverter 144 may invert the signal of the node 114 and drive the inverted signal to the node 113. Accordingly, the inverters 143 and 144 may be able to compensate for a phase skew between the first pull-up driving signal PU_1 and the first pull-down driving signal PD_1.

Figure 3:
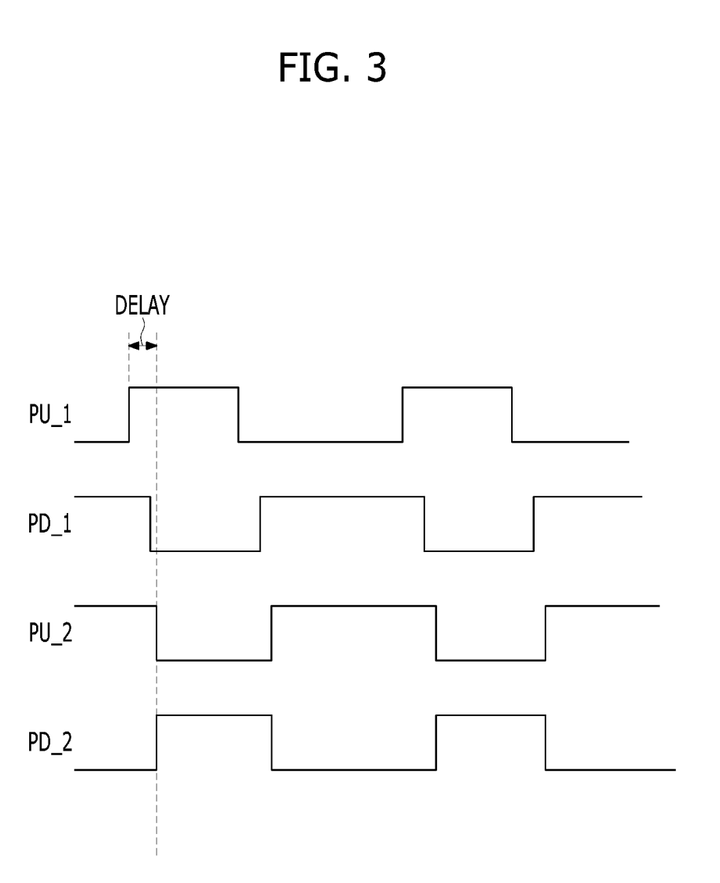
FIG. 3 is a diagram illustrating a phase skew compensation operation of a phase skew compensation circuit shown in FIG. 1.

FIG. 3 is a diagram illustrating a phase skew compensation operation of the phase skew compensation circuit 130. From FIG. 3, it may be seen that a phase skew is not present between the second pull-up driving signal PU_2 and the second pull-down driving signal PD_2 although a phase skew is present between the first pull-up driving signal PU_1 and the first pull-down driving signal PD_1. In FIG. 3, a delay DELAY indicates the delay of the phase skew compensation circuit 130. The delay DELAY may be generated by the inverters 133, 134, and 139 and the inverters 135, 136, and 140.

Figure 4:
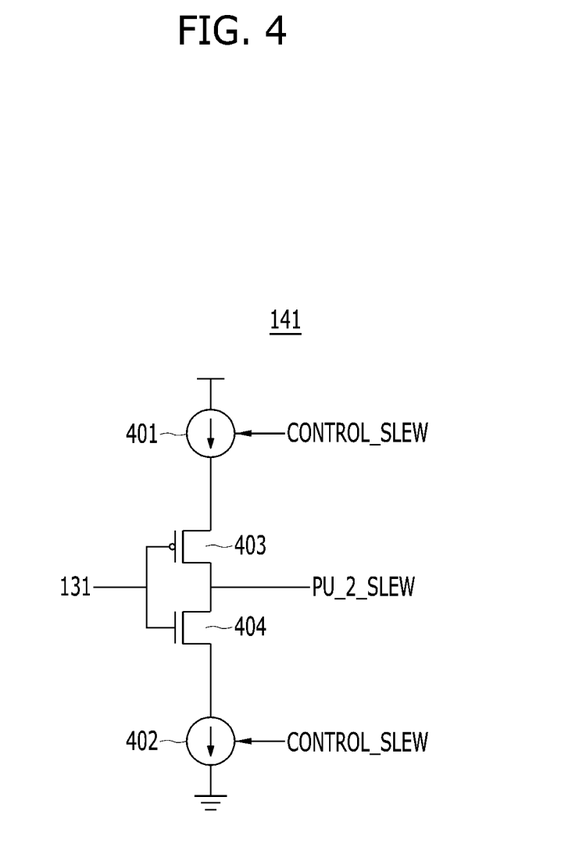
FIG. 4 is a diagram illustrating an embodiment of a variable driving inverter of the phase skew compensation circuit shown in FIG. 1.

FIG. 4 is a diagram illustrating an embodiment of the variable driving inverter 141 of the phase skew compensation circuit 130. Referring to FIG. 4, the variable driving inverter 141 may include current sources 401 and 402 configured to control a sourcing current and a sinking current in response to the slew rate control signal CONTROL_SLEW, a PMOS transistor 403, and an NMOS transistor 404. The PMOS transistor 403 and the NMOS transistor 404 may invert the signal of the node 131 and output the inverted signal as the second auxiliary pull-up driving signal PU_2_SLEW. The current sources 401 and 402 may control an amount of the sourcing current supplied to the PMOS transistor 403 and an amount of the sinking current supplied to the NMOS transistor 404, respectively. Accordingly, the driving power of the PMOS transistor 403 and the NMOS transistor 404 may be controlled by the slew rate control signal CONTROL_SLEW. When the amount of current of the current sources 401 and 402 is increased, the slew rate of the second auxiliary pull-up driving signal PU_2_SLEW may become high. When the amount of current of the current sources 401 and 402 is decreased, the slew rate of the second auxiliary pull-up driving signal PU_2_SLEW may become low. The variable driving inverter 142 may be configured in the same manner as the variable driving inverter 141 in FIG. 4.

Referring back to FIG. 1, the pull-up driver 150 may pull-up drive the output node OUTPUT in response to the second pull-up driving signal PU_2. The pull-up driver 150 may further pull-up drive the output node OUTPUT in response to the second auxiliary pull-up driving signal PU_2_SLEW. The pull-up driver 150 may pull-up drive the output node OUTPUT when a level of the second pull-up driving signal PU_2 is a "high" level. The pull-up driver 150 may include an NMOS transistor 151 configured to pull-up drive the output node OUTPUT in response to the second pull-up driving signal PU_2, an NMOS transistor 153 configured to pull-up drive the output node OUTPUT in response to the second auxiliary pull-up driving signal PU_2_SLEW, and a resistor 155 coupled between the NMOS transistors 151 and 153 and the output node OUTPUT. In general, the pull-up driver 150 is configured with PMOS transistors. In FIG. 1, however, the pull-up driver 150 is configured with the NMOS transistors 151 and 153 for the purpose of a higher speed operation.

The pull-down driver 170 may pull-down drive the output node OUTPUT in response to the second pull-down driving signal PD_2. The pull-down driver 170 may further pull-down drive the output node OUTPUT in response to the second auxiliary pull-down driving signal PD_2_SLEW. The pull-down driver 170 may pull-down drive the output node OUTPUT when a level of the second pull-down driving signal PD_2 is a "high" level. The pull-down driver 170 may include an NMOS transistor 171 configured to pull-down drive the output node OUTPUT in response to the second pull-down driving signal PD_2, an NMOS transistor 173 configured to pull-down drive the output node OUTPUT in response to the second auxiliary pull-down driving signal PD_2_SLEW, and a resistor 175 coupled between the NMOS transistors 171 and 173 and the output node OUTPUT.

The transmitter 100 may transmit, to the output node, data having high quality, which includes an emphasis waveform, has a phase skew compensated for, and has a slew rate controlled, through a simple construction.

Figure 5:
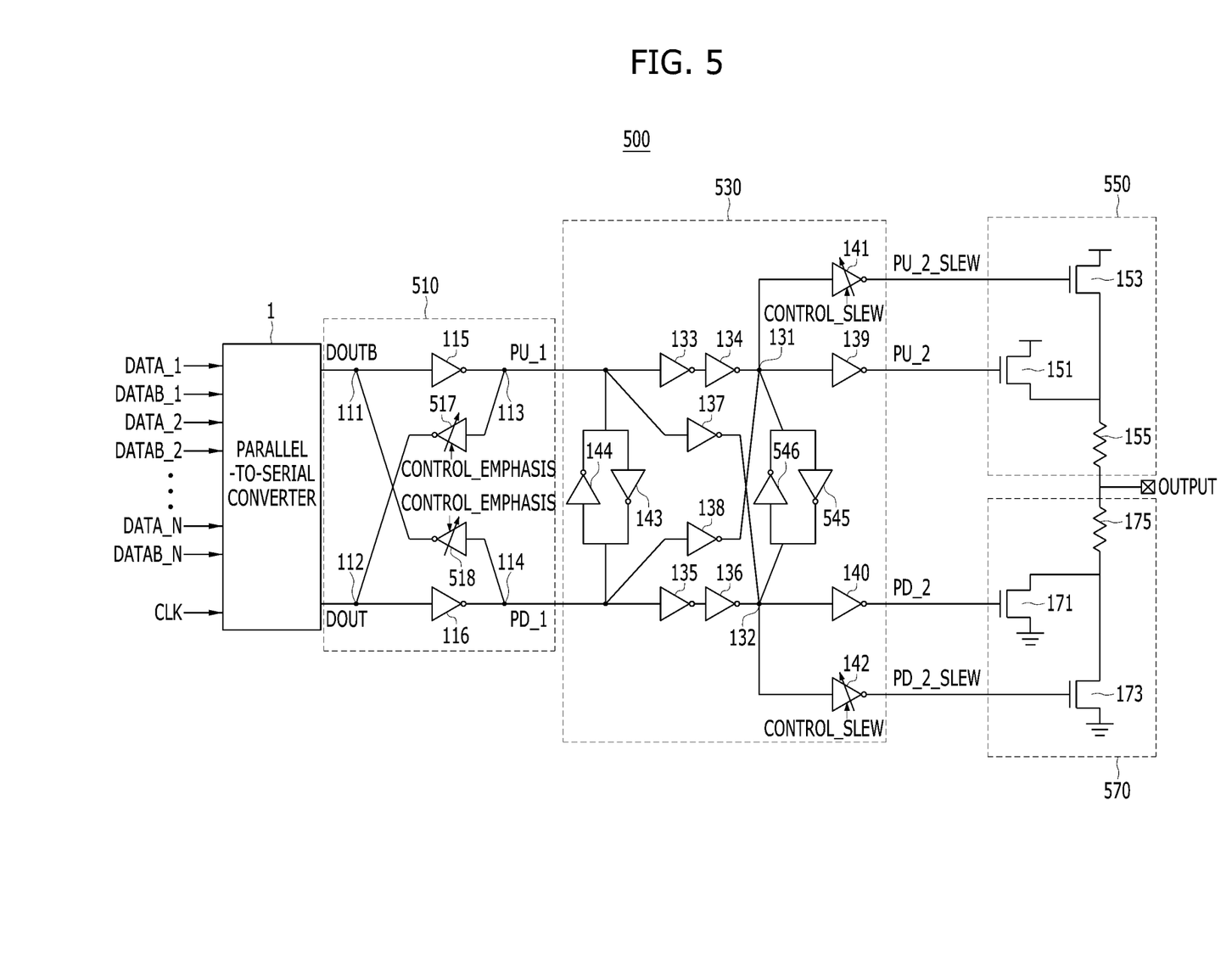
FIG. 5 is a diagram illustrating a configuration of a transmitter according to another embodiment of the present invention.

FIG. 5 is a diagram illustrating a configuration of a transmitter 500 according to another embodiment.

Referring to FIG. 5, the transmitter 500 may include an emphasis circuit 510, a phase skew compensation circuit 530, a pull-up driver 550 and a pull-down driver 570.

In the emphasis circuit 510, it may be seen that the inverters 117 and 118 of the emphasis circuit 110 shown in FIG. 1 have been replaced with variable driving inverters 517 and 518. The driving power of the variable driving inverters 517 and 518 may be controlled by an emphasis control signal CONTROL_EMPHASIS. Each of the variable driving inverters 517 and 518 may be configured in the same manner as the variable driving inverter 141 shown in FIG. 4. Since the driving power of the variable driving inverters 517 and 518 is controlled by the emphasis control signal CONTROL_EMPHASIS, the strength of emphasis driving of the emphasis circuit 510 may be controlled by the emphasis control signal CONTROL_EMPHASIS.

The phase skew compensation circuit 530 may further include inverters 545 and 546 compared to the phase skew compensation circuit 130 shown in FIG. 1. The inverter 545 may invert the signal of the node 131 and drive the inverted signal to the node 132. The inverter 546 may invert the signal of the node 132 and drive the inverted signal to the node 131. Accordingly, a phase skew between the nodes 131 and 132 may be further compensated for by the inverters 545 and 546.

The pull-up driver 550 and the pull-down driver 570 may be configured in the same manner as the pull-up driver 150 and the pull-down driver 170 shown in FIG. 1, respectively.

According to embodiments of the present disclosure, the quality of the transmitter may be improved by using a simple structure.

Although various embodiments have been described for illustrative purposes, it will be apparent to those skilled in the art that various changes and modifications may be made without departing from the spirit and scope of the disclosure as defined in the following claims.

What is claimed is:

1. A transmitter comprising:
    an emphasis circuit suitable for generating a first pull-down driving signal in response to first data and delayed second data, and generating a first pull-up driving signal in response to second data and delayed first data, wherein the first and second data are a differential pair;
    a phase skew compensation circuit suitable for compensating for a phase skew between the first pull-up driving signal and the first pull-down driving signal to generate a second pull-up driving signal and a second pull-down driving signal;
    a pull-up driver suitable for pull-up driving an output node in response to the second pull-up driving signal; and
    a pull-down driver suitable for pull-down driving the output node in response to the second pull-down driving signal.

2. The transmitter of claim 1, wherein the phase skew compensation circuit:
    further generates an auxiliary pull-up driving signal having a slew rate-controlled waveform of the second pull-up driving signal, of which a slew rate is controlled according to a slew rate control signal; and
    further generates an auxiliary pull-down driving signal having a slew rate-controlled waveform of the second pull-down driving signal, of which a slew rate is controlled according to the slew rate control signal.

3. The transmitter of claim 2, wherein:
    the pull-up driver pull-up further drives the output node in response to the auxiliary pull-up driving signal, and
    the pull-down driver pull-down further drives the output node in response to the auxiliary pull-down driving signal.

4. The transmitter of claim 1, wherein the emphasis circuit comprises:
    a first node to which the second data are input;
    a second node to which the first data are input;
    a third node from which the first pull-up driving signal is output;
    a fourth node from which the first pull-down driving signal is output;
    a first inverter suitable for inverting a signal of the first node to drive the third node;
    a second inverter suitable for inverting a signal of the second node to drive the fourth node;
    a third inverter suitable for inverting a signal of the third node to drive the second node; and
    a fourth inverter suitable for inverting a signal of the fourth node to drive the first node,
    wherein a driving power of the third inverter and the fourth inverter is smaller than a driving power of the first inverter and the second inverter.

5. The transmitter of claim 4, wherein the driving power of the third inverter and the fourth inverter is controlled according to an emphasis control signal.

6. The transmitter of claim 1, wherein the phase skew compensation circuit comprises:
    fifth and sixth inverters coupled in series to drive, to a fifth node, a signal of a third node to which the first pull-up driving signal is applied;
    seventh and eighth inverters coupled in series to drive, to a sixth node, a signal of a fourth node to which the first pull-down driving signal is applied;
    a ninth inverter suitable for inverting the signal of the third node to drive the sixth node;
    a tenth inverter suitable for inverting the signal of the fourth node to drive the fifth node;
    an eleventh inverter suitable for outputting the second pull-up driving signal by inverting a signal of the fifth node; and
    a twelfth inverter suitable for outputting the second pull-down driving signal by inverting a signal of the sixth node.

7. The transmitter of claim 5, wherein the phase skew compensation circuit further comprises:
    a thirteenth inverter suitable for inverting the signal of the third node to drive the fourth node; and
    a fourteenth inverter suitable for inverting the signal of the fourth node to drive the third node.

8. The transmitter of claim 7, wherein the phase skew compensation circuit further comprises:
    a fifteenth inverter suitable for inverting a signal of the fifth node to drive the sixth node; and
    a sixteenth inverter suitable for inverting a signal of the sixth node to drive the fifth node.

9. The transmitter of claim 1, wherein the pull-up driver comprises:
    a first NMOS transistor suitable for pull-up driving the output node in response to the second pull-up driving signal; and
    a second NMOS transistor suitable for pull-down driving the output node in response to the second pull-down driving signal.

10. The transmitter of claim 9, wherein:
    the pull-up driver further comprises:
    a first resistor coupled between a drain of the first NMOS transistor and the output node; and
    the pull-down driver further comprises a second resistor coupled between a source of the second NMOS transistor and the output node.

11. A transmitter comprising:
    a first inverter suitable for inverting a signal of a first node to which second data are applied to drive a third node;
    a second inverter suitable for inverting a signal of a second node to which first data are applied to drive a fourth node;
    a third inverter suitable for inverting a signal of the third node to drive the second node;
    a fourth inverter suitable for inverting a signal of the fourth node to drive the first node;
    fifth and sixth inverters coupled in series to drive the signal of the third node to a fifth node;
    seventh and eighth inverters coupled in series to drive the signal of the fourth node to a sixth node;
    a ninth inverter suitable for inverting the signal of the third node to drive the sixth node;
    a tenth inverter suitable for inverting the signal of the fourth node to drive the fifth node;
    an eleventh inverter suitable for outputting a pull-up driving signal by inverting a signal of the fifth node;
    a twelfth inverter suitable for outputting a pull-down driving signal by inverting a signal of the sixth node;
    a pull-up driver suitable for pull-up driving an output node in response to the pull-up driving signal; and
    a pull-down driver suitable for pull-down driving the output node in response to the pull-down driving signal.

12. The transmitter of claim 11, further comprising:
a thirteenth inverter suitable for inverting the signal of the third node to drive the fourth node; and
a fourteenth inverter suitable for inverting the signal of the fourth node to drive the third node.

13. The transmitter of claim 11, further comprising:
a first variable driving inverter suitable for inverting the signal of the fifth node to generate an auxiliary pull-up driving signal, and having a driving power controlled according to a slew rate control signal; and
a second variable driving inverter suitable for inverting the signal of the sixth node to generate an auxiliary pull-down driving signal, and having a driving power controlled by the slew rate control signal.

14. The transmitter of claim 13, wherein:
the pull-up driver pull-up drives the output node in response to the auxiliary pull-up driving signal, and
the pull-down driver pull-down drives the output node in response to the auxiliary pull-down driving signal.

15. The transmitter of claim 11, wherein the pull-up driver comprises:
a first NMOS transistor suitable for pull-up driving the output node in response to the pull-up driving signal; and
a second NMOS transistor suitable for pull-down driving the output node in response to the pull-down driving signal.

16. The transmitter of claim 15, wherein:
the pull-up driver further comprises a first resistor coupled between a drain of the first NMOS transistor and the output node; and
the pull-down driver further comprises a second resistor coupled between a source of the second NMOS transistor and the output node.

17. The transmitter of claim 12, wherein a driving power of the third inverter and the fourth inverter is smaller than a driving power of the first inverter and the second inverter.

18. The transmitter of claim 17, wherein the driving power of the third inverter and the fourth inverter is controlled according to an emphasis control signal.

19. An emphasis circuit comprising:
a first inverter configured to invert a first data to drive a first output node;
a second inverter configured to invert a second data to drive a second output node;
a third inverter configured to invert a signal of the first output node to drive a node to which the first data is input; and
a fourth inverter configured to invert a signal of the second output node to drive a node to which the second data is input,
wherein the first and second data are a differential pair,
wherein a driving power of the third inverter and the fourth inverter is controlled according to an emphasis control signal.

* * * * *